United States Patent [19]

Matsumoto

[11] Patent Number: 5,564,093
[45] Date of Patent: Oct. 8, 1996

[54] FREQUENCY MODULATION RECEIVING APPARATUS HAVING TWO INTERMEDIATE-FREQUENCY BAND PASS FILTERS

[75] Inventor: Yutaka Matsumoto, Yokohama, Japan

[73] Assignee: Kabushiki Kasiha Toshiba, Kawasaki, Japan

[21] Appl. No.: 455,034

[22] Filed: May 31, 1995

Related U.S. Application Data

[63] Continuation of Ser. No. 979,312, Nov. 20, 1992, abandoned.

[30] Foreign Application Priority Data

Nov. 22, 1991 [JP] Japan ................................. 3-307475
Mar. 11, 1992 [JP] Japan ................................. 4-052451

[51] Int. Cl.⁶ ........................................... H04B 1/10
[52] U.S. Cl. ..................... 455/266; 455/295; 455/307; 455/339
[58] Field of Search ............................. 455/205, 206, 455/266, 295, 212, 225, 306, 307, 311, 339, 340, 254

[56] References Cited

U.S. PATENT DOCUMENTS

| | | | |
|---|---|---|---|
| 4,352,208 | 9/1982 | Schroeder | 455/266 |
| 4,356,568 | 10/1982 | Ogita et al. | 455/212 |
| 4,551,755 | 11/1985 | Matsuda et al. | 455/266 |
| 4,563,651 | 1/1986 | Ohta et al. | 455/266 |
| 4,907,293 | 3/1990 | Ueno | 455/295 |
| 5,241,697 | 8/1993 | Hansen | 455/266 X |

FOREIGN PATENT DOCUMENTS

| | | |
|---|---|---|
| 0435455 | 7/1991 | European Pat. Off. . |
| 0443170 | 8/1991 | European Pat. Off. . |
| 63-194423 | 8/1988 | Japan . |
| 1-108632 | 7/1989 | Japan . |
| 2-32248 | 2/1990 | Japan . |

OTHER PUBLICATIONS

European Search Report, Application No. EP 92 11 9801, Mar. 1, 1993.

Patent Abstract of Japan, vol. 8, No. 229 (Oct. 1984).

*Primary Examiner*—Reinhard J. Eisenzopf
*Assistant Examiner*—Philip J. Sobutka
*Attorney, Agent, or Firm*—Finnegan, Henderson, Farabow, Garrett & Dunner, L.L.P.

[57] ABSTRACT

A frequency modulation receiving apparatus comprises a signal-converting circuit for converting a signal received by an antenna into a signal consisting of wave clusters having various frequencies, first limiting circuit for limiting those of the wave clusters which have frequencies outside a first frequency range, second limiting circuit for limiting those of the wave clusters which have frequencies outside a second frequency range narrower than the first frequency range, shearing circuit for combining and outputting a ratio of a signal output by the first limiting circuit and a signal output by the second limiting circuit, frequency-demodulating circuit for frequency-demodulating a signal output by the selecting circuit, detecting circuit for detecting whether or not an adjacent interfering wave exists in a signal output by the frequency-demodulating circuit, and for outputting a signal indicating whether or not an adjacent interfering wave exists in the signal, and control circuit for delaying a signal output by the detecting circuit and supplying the signal to the selecting circuit, thereby to control the selecting circuit.

10 Claims, 9 Drawing Sheets

FREQUENCY MODULATION RECEIVING APPARATUS HAVING TWO INTERMEDIATE-FREQUENCY BAND PASS FILTERS

This application is a continuation of application Ser. No. 07/979,312, filed Nov. 20, 1992, now abandoned.

BACKGROUND OF THE INVENTION

1. Field of the Invention

The present invention relates to an FM receiver capable of preventing adjacent interference and, more particularly to an FM receiver designed for use in vehicles.

2. Description of the Related Art

As is known in the art, adjacent waves often causes interference in FM receivers, especially in vehicle-mounted FM receivers. The method hitherto used to eliminate the adjacent interference occurring in an FM receiver was to switch the frequency band of the ceramic filter or the like incorporated in the FM receiver, which determines the IF (Intermediate Frequency) band, from a broad one to a narrow one. At present, the IF-band switching is performed in accordance with the data by output by a system which is other than the system for receiving desired signals and which is designed to prevent adjacent interference. It is expected that most conventional FM receivers will be soon replaced by less expensive self-detecting FM receivers in which the system for receiving desired signals detects and controls adjacent interference.

In the conventional FM receiver capable of preventing adjacent interference, adjacent interference is prevented in the following manner. The + detuning adjacent interference detector and the − detuning adjacent interference detector, both incorporated in the FM receiver, detect the intermediate frequencies derived from the desired station's frequency. The intermediate frequencies are added, thereby finding a adjacent interfering signal. The adjacent interfering signal is removed.

The conventional FM receiver has a complex structure.

SUMMARY OF THE INVENTION

The object of the present invention is to provide a frequency modulation receiving apparatus which can remove noise resulting from the wave interfering with a desired station's signal wave and which can yet be manufactured at low cost.

According to this invention, there is provided a frequency modulation receiving apparatus comprising: signal-converting means for converting a signal received by an antenna, into a signal consisting of wave clusters having various frequencies; first limiting means for limiting those of the wave clusters which have frequencies except a first frequency range; second limiting means for limiting those of the wave clusters which have frequencies except a second frequency range narrower than the first frequency range; selecting means for selecting and outputting a signal output by the first limiting means or a signal output by the second limiting means, frequency-demodulating means for frequency-demodulating a signal output by the selecting means; detecting means for detecting whether or not an adjacent interfering wave exists in a signal output by the frequency-demodulating means, and for outputting a signal indicating whether or not an adjacent interfering wave exists in the signal; and control means for delaying a signal output by the detecting means and supplying the signal to the selecting means, thereby to control the selecting means.

The signal output by the detecting means, which indicates whether or not the signal output by the frequency-demodulating means contains a signal having a frequency adjacent to a desired station's frequency, is delayed by a predetermined time, thereby producing a control signal. In accordance with the control signal, the selecting means selects the signal output by the first limiting means the signal output by the second limiting means, thereby switching a first IF band to a second IF band, or vice versa. As a result, an adjacent interfering signal, if any, is removed from the signal output by the frequency-demodulating means. Since the control signal is delayed by an appropriate time, the first and second IF bands are switched between them so frequently that the wave-receiving efficiency will not decrease even if the adjacent interfering wave is relatively unstable. Though simple in structure, the frequency modulation receiving apparatus according to the invention can remove the noise resulting from an adjacent interfering wave, thus receiving FM signals with high reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF PREFERRED EMBODIMENTS

Embodiments of the present invention will now be described, with reference to the accompanying drawings.

Figure 1:
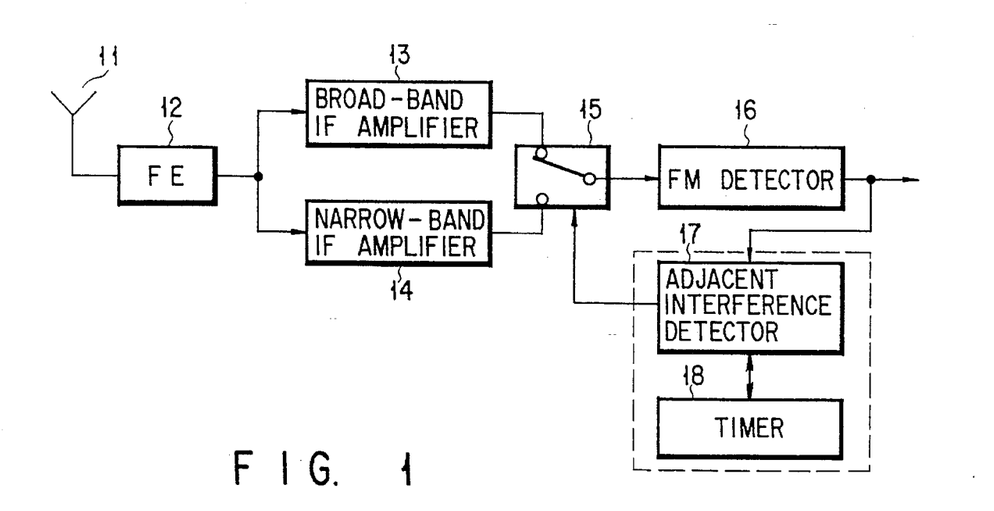
FIG. 1 is a block diagram showing a first embodiment of the present invention.

FIG. 1 shows an FM receiver according to the first embodiment of the invention. The FM receiver comprises an antenna 11, a front-end (FE) section 12, a broad-band IF amplifier 13, a narrow-band IF amplifier 14, a changeover switch 15, an FM detector 16, an adjacent interference detector 17, and a timer 18. The EF section 12 is connected to the antenna 11. The broad-band IF amplifier 13 is connected to the output of the FE section 12. The narrow-band IF amplifier 14 is connected to the output of the FE section 12. The changeover switch 15 has two stationary contacts connected to the outputs of the amplifiers 13 and 14, respectively, and one movable contact connected to the input of the FM detector 16, for selecting the output of the amplifier 13 or that of the amplifier 14, thereby switching the IF band of the receiver. The FM detector 16 is designed to detect the output of the amplifier 13 or that of the amplifier 14, selected by operating the switch 15.

As is shown in FIG. 1, the FM receiver further comprises an adjacent interference detector 17 and a timer 18. The detector 17 is connected to the output of the FM detector 16, for detecting an adjacent interfering wave, if any, in the output of the FM detector 16. The timer 18 is connected to the output of the adjacent interference detector 17, for delaying the output of the detector 17. The output of the timer 18 is supplied to the switch 15 as an IF-band switching signal.

The adjacent interference detector 17 is designed to detects the magnitude of the adjacent interference on the output of the FM detector 16, in terms of, for example, the noise of the signal output by the FM detector 16. As is known in the art, adjacent interference occurs when the signal input to the FM detector 16 falls within an interoffice band which covers both target wave and an adjacent interfering wave. If the adjacent interference occurs, the signal output by the FM detector 16 consists of three components: (1) a signal corresponding to the target wave; (2) a signal corresponding to the adjacent interfering wave; and (3) a random signal having a center frequency which is the difference between the center frequency of the target wave and that of the adjacent interfering wave. In the adjacent interference detector 17, the random signal (generally known as "beat") is extracted by means of a high-pass filter (HPF) or a band-pass filter (BPF) and is used to detect the adjacent interference.

In operation, when the adjacent interference detector 17 detects adjacent interference while the changeover switch 15 connects the output of the broadband IF amplifier 13 to the FM detector 16, it outputs a an IF-band switching signal. The signal is supplied through the timer 18 to the switch 15. In response to the signal, the changeover switch 15 connects the output of the narrow-band IF amplifier 14 to the FM detector 16. The IF band of the FM receiver is thereby switched from the broad IF band to the narrow IF band.

In the meantime, the timer 18 starts measuring time upon receipt of the signal output by the adjacent interference detector 17. Upon lapse of the predetermined time period set in it, the timer 18 generates an IF-band switching signal. This signal is supplied to the changeover switch 15, which connects the broad-band IF amplifier 13 to the FM detector 16. This time, the IF band of the FM receiver is switched from the narrow IF band to the broad IF band.

If the FM detector 16 detects adjacent interference at the time the IF band is switched from the narrow IF band to the broad IF band, it output a an IF-band switching signal, which is supplied via the timer 18 to the switch 15. Then, the switch 15 connects the narrow IF band amplifier 14 to the FM detector 16, changing the IF band from the broad IF band to the narrow IF band. Then, the timer 18 starts measuring time upon receipt of the signal output by the detector 17 and generates an IF-band switching signal upon lapse of the predetermined time period. This signal is supplied to the changeover switch 15, which connects the broad IF amplifier 13 to the FM detector 16, switching the IF band from the narrow IF band to the broad IF band.

Thereafter, every time the FM detector 16 detects adjacent interference at the time the IF band of the FM receiver is switched from the narrow IF band to the broad IF band, the sequence of the operations described in the preceding paragraph is repeated.

If the FM detector 16 detects no adjacent interference immediately after the IF band has been switched from the narrow IF band to the broad IF band, the output of the broad-band IF amplifier 13 is continuously supplied to the FM detector 16.

Figure 2:
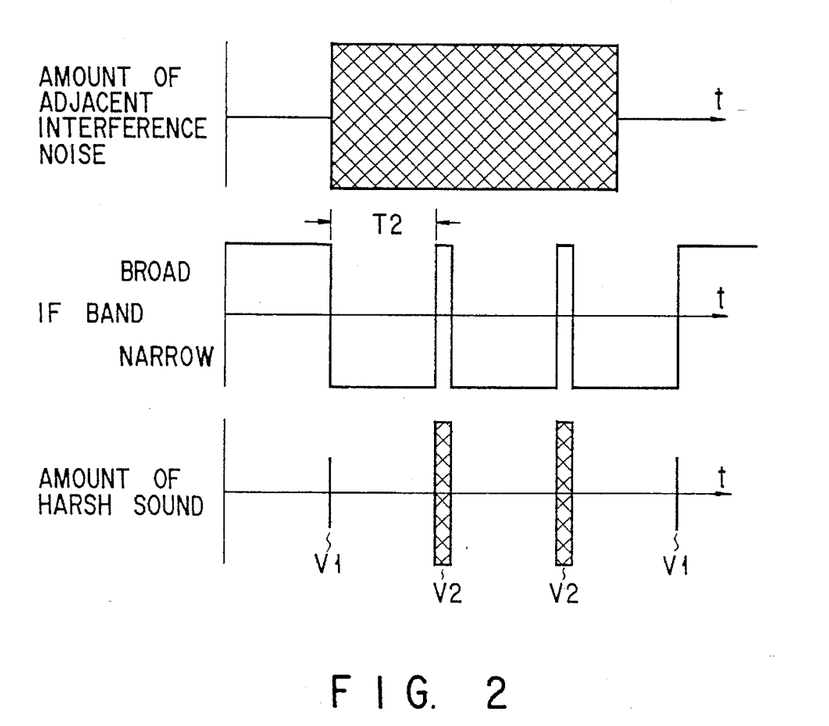
FIG. 2 is a diagram showing the waveforms of signals processed in the first embodiment.

In the first embodiment (FIG. 1), the IF band is not switched back to the narrow IF band until the predetermined time period set in the timer 18 elapses after the detector 17 has detected an adjacent interfering wave and the switch 15 has therefore switched the IF band from the broad IF band to the narrow IF band. Therefore, the frequency at which noise v1 is generated from the output of the FM receiver, due to the IF-band switching, can be reduced as can be understood from FIG. 2 only if the period T2 set in the timer 18 is relatively long. Moreover, since noise v2 due to the adjacent interference is made at intervals of the period T2 set in the timer 18, the frequency at which this noise v2 is made can be decreased more than in the conventional FM receiver, merely by setting a long period as the period T2. As a result, the sound reproduced from the output signal of the FM receiver contains but a very small harsh component.

As is evident from FIG. 1, the FM receiver need not have so complex an adjacent interference detector as is required in the conventional FM receiver. The FM receiver according to the present invention can be manufactured at a lower cost.

The time period T2 set in the timer 18 should be determined in accordance with various conditions. It may be, for example, about 1 second. The timer 18 is a one-show multivibrator or the like. The period T2 can be set in various methods; it may be set by means of a microcomputer in line with the specification of the FM receiver.

Figure 3:
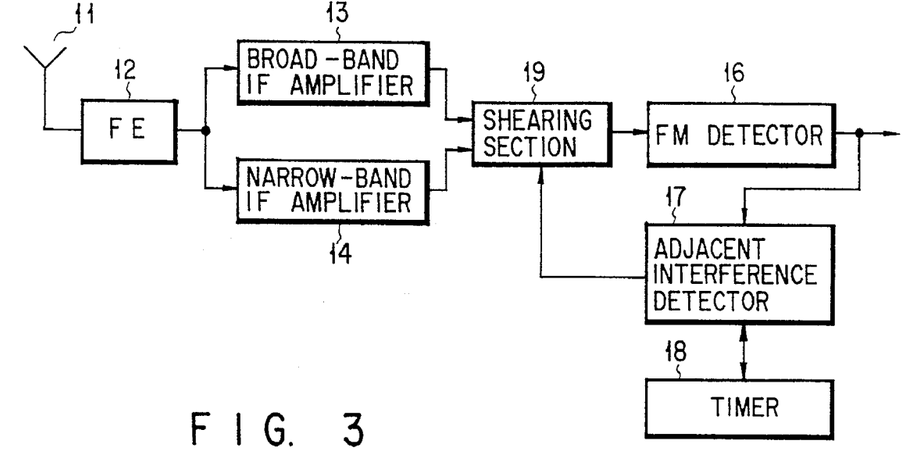
FIG. 3 is a block diagram showing a second embodiment of the invention.

FIG. 3 shows an FM receiver according to the second embodiment of this invention. This FM receiver is identical to the FM receiver of FIG. 1, except for two respects only. First, a shearing section 19 is used in place of the changeover switch 15. Secondly, the output of the timer 18 is supplied to the adjacent interference detector 17.

In the FM receiver of FIG. 3, the shearing section 19 outputs 100% of the output generated by the broadband IF amplifier 13 when the adjacent interference detector 17 detects no adjacent interference. The section 19 outputs 100% of the output generated by the narrow-band IF amplifier 14 until the period set in the timer 18 elapses after the detector 17 has detected adjacent interference. Hence, the IF signal supplied to the FM detector 16 during the period set in the timer 18 elapses after the detection of the adjacent interference is the output of the narrow-band IF amplifier 14 which amplifies that portion of the input IF signal which has various frequencies falling within the narrow IF band. Therefore, the noise resulting from the IF-band switching can be reduced, and the sound reproduced of the output signal of the FM receiver will therefore contain but so small a harsh component as the sound reproduced from the output signal of the FM receiver of FIG. 1. In addition, it can effectively remove the noise resulting from the adjacent interference.

The FM receiver according to the second embodiment of the invention is advantageous in another respect. The outputs of the IF amplifiers 13 and 14 can be added, in any ratio desired, forming an FM signal to be supplied to the FM detector 16. More precisely, the shearing section 19 can add a portion (e.g., 10%) of the output of the broad-band IF amplifier 13 to a portion (e.g., 90%) of the output of the narrow-band IF amplifier 14 while the detector 17 is detecting adjacent interference. That portion of the output of the broad-band IF amplifier 13, which is input to the FM detector 16, can improve the quality of the sound reproduced from the output signal of this FM receiver.

Figure 4:
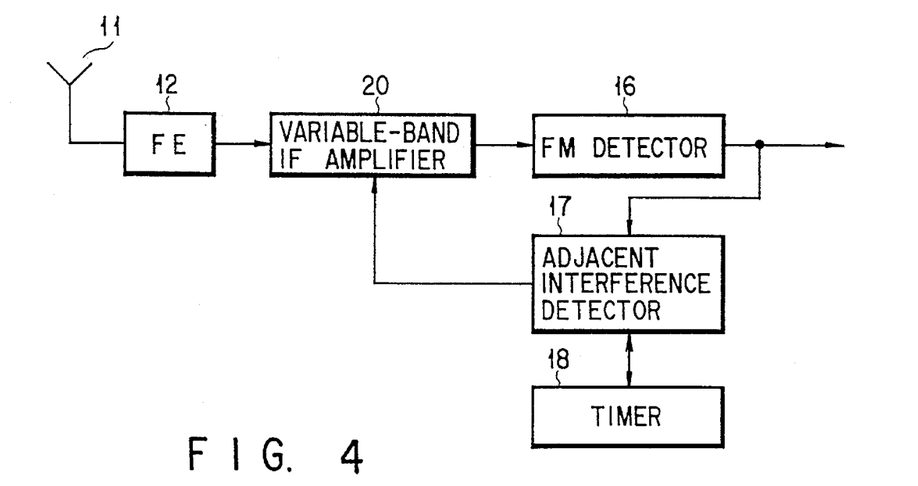
FIG. 4 is a block diagram showing a third embodiment of this invention.

FIG. 4 shows an FM receiver which is the third embodiment of this invention. The FM receiver shown in FIG. 4 is identical to the FM receiver of FIG. 1, except for two respects only. First, a variable-band IF amplifier 20 is used in place of the broad-band IF amplifier 13, the narrow-band IF amplifier, and the changeover switch 15. Secondly, the output of the timer 18 is supplied to the adjacent interference detector 17 as in the second embodiment (FIG. 3).

In the FM receiver of FIG. 4, the variable-band IF amplifier 20 is controlled by the output by the detector 17 such that it assumes a broad band when the adjacent interference detector 17 detects no adjacent interference whatever, and assumes a narrow band when the adjacent interference detector 17 detects adjacent interference. Once the IF band of the variable-band IF amplifier 20 has changed from the broad IF band to the narrow IF band, it will not be switched back to the broad IF band until the period set in the timer 18 elapses. Hence, the noise resulting from the IF-band switching can be reduced, and the sound reproduced of the output signal of the FM receiver will therefore contain but a small harsh component. In addition, it can effectively remove the noise resulting from the adjacent interference.

The adjacent interference detector 17 incorporated in the first, second and third embodiments comprises a high-pass filter (HPF) or a band-pass filter (BPF). The filter detects and extracts the beat resulting from an adjacent interfering wave, and the beat extracted is used to detect adjacent interference. Hence, the adjacent interference detector 17 responds to the distorted harmonic wave generated from the FM detector 16 when the FM modulation factor of the target station is high. Consequently, the detector 17 will function as if there had occurred adjacent interference, and in the first embodiment (FIG. 1), for example, the changeover switch 15 selects the output of the narrow IF amplifier 14, thus switching the IF band from the broad IF band to the narrow IF one.

Figure 5A:
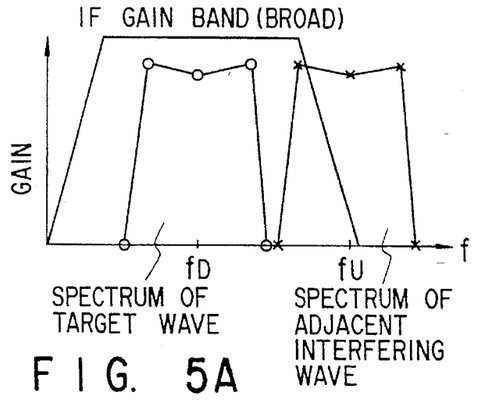
FIGS. 5A and 5B, FIGS. 6A and 6B, and FIGS. 7A and 7B are graphs illustrating the gain and amplitude characteristic of the IF amplifier used in the third embodiment.
Figure 5B:
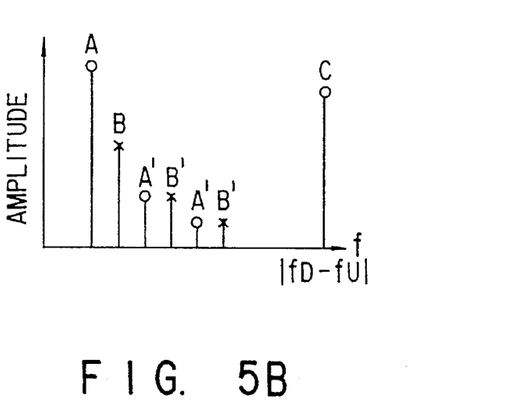

FIG. 5A is a graph illustrating the gain and amplitude characteristic of the broad-band IF amplifier 13 used in the first embodiment (FIG. 1). Plotted on the abscissa is the frequency f of the output of the IF amplifier 13, and plotted on the ordinate is the the gain and amplitude of the output of the IF amplifier 13. In FIG. 5A, fD is the center frequency of the target wave, and fU is the center frequency of the adjacent interfering wave. The trapezoid shown in FIG. 5A is the IF gain region of the broad-band IF amplifier 13. FIG. 5B is a graph representing the amplitude characteristic which the IF amplifier 13 assumes while receiving an FM signal from the FE section 12. In FIG. 5B, A is the amplitude of the fundamental waveform of the target FM wave, B is the amplitude of the fundamental waveform of the interfering FM wave, A' is the amplitude of the harmonic waveform of the target FM wave, B' is the amplitude of the harmonic waveform of the interfering FM wave, and C is the amplitude of the beat.

Figure 6A:
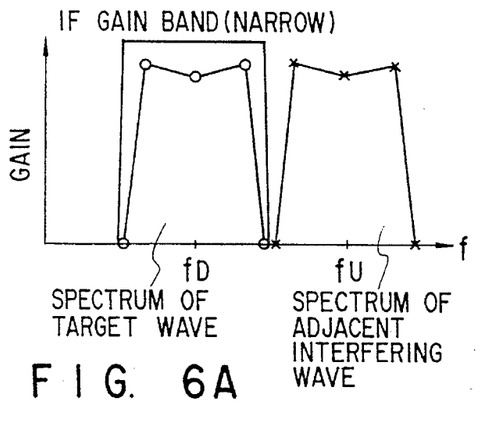
Figure 6B:
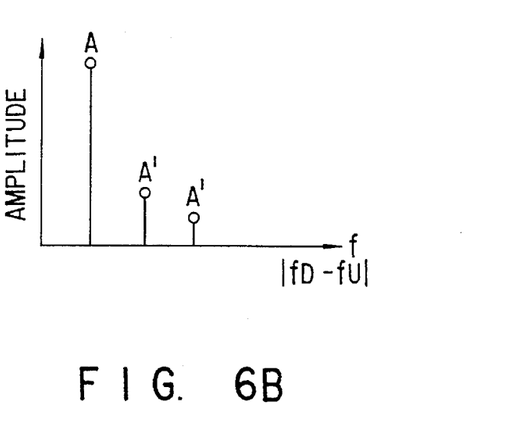

Similarly, FIG. 6A illustrates the gain and amplitude characteristic of the narrow-band IF amplifier 14 used in the first embodiment (FIG. 1). In FIG. 6A, fD is the center frequency of the target wave, and fU is the center frequency of the adjacent interfering wave. The trapezoid shown in FIG. 6A is the IF gain region of the narrow-band IF amplifier 14. FIG. 6B is a graph representing the amplitude characteristic which the IF amplifier 14 assumes while receiving an FM signal from the FE section 12. In FIG. 6B, A is the amplitude of the fundamental waveform of the target FM wave, and A' is the amplitude of the harmonic waveform of the target FM wave.

As is evident from FIGS. 5A and 5B and FIGS. 6A and 6B, the amplitude C of the beat is reduced to nil for the frequency band of fD–fU when the the output of the narrow-band IF amplifier 14 is selected, thus switching the IF band to the narrow IF band.

Figure 7A:
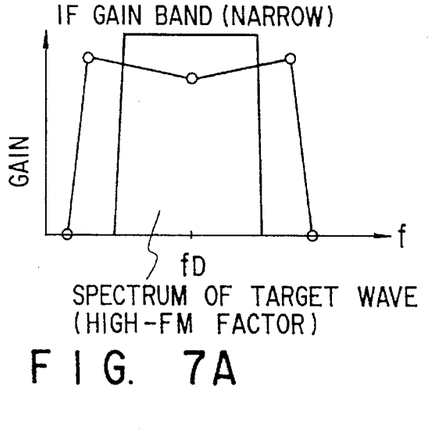
Figure 7B:
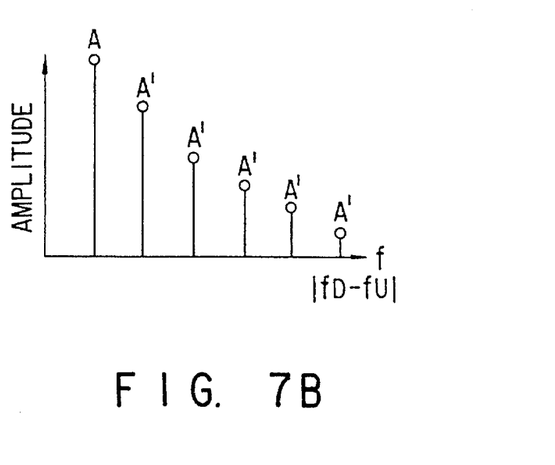

FIG. 7A illustrates the gain and amplitude characteristic which the narrow-band IF amplifier 14 used in the first embodiment (FIG. 1) exhibits when no adjacent interfering waves exist in the FM input signal but the FM modulation factor of the target station is high. FIG. 7B shows the amplitude characteristic which the IF amplifier 14 assumes in the same receiving condition. As can be well understood from FIG. 7B, the target wave contains several harmonic components A', though the amplitude C of the beat component is eliminated for the frequency band of fD–fU. Hence, the detector 17 will operated as if there had occurred adjacent interference. In other words, non-existent adjacent interference is detected in the first, second and third embodiments.

Figure 8:
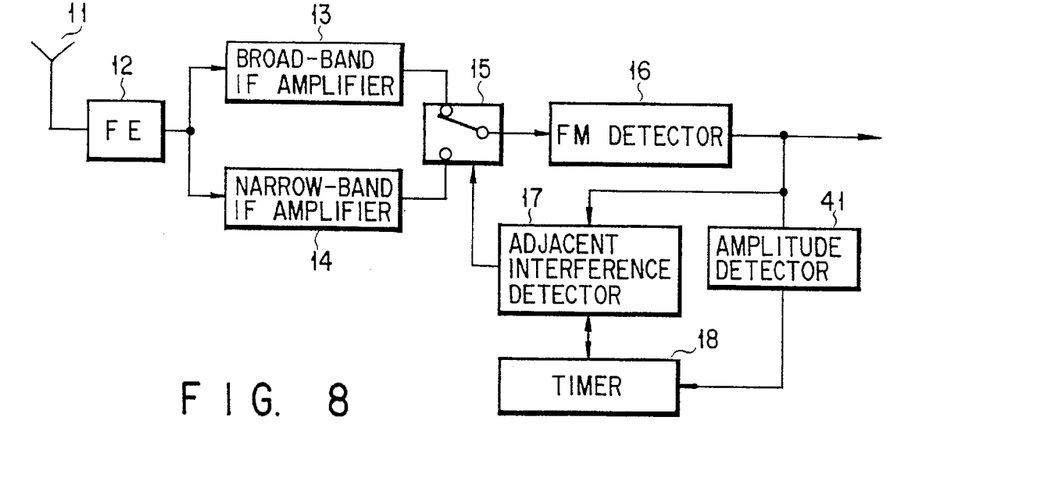
FIG. 8 is a block diagram showing a fourth embodiment of the present invention.

FIG. 8 shows an FM receiver which is the fourth embodiment of the present invention. This FM receiver is an improvement over the first, second and third embodiments and is so designed as to prevent the detection of non-existent adjacent interference.

The FM receiver of FIG. 8 is different only in that an FM amplitude detector 41 is connected between the output of the FM detector 16 and the adjacent interference detector 17. In the FM amplitude detector 41, a predetermined threshold value is set for the amplitude of the FM signal output by the FM detector 16. The detector 41 compares the amplitude of the FM signal output by the detector 16 with the threshold value and generates a control signal when the amplitude of the FM signal is equal to or greater than the threshold value. The control signal is supplied to the timer 18. In response to the control signal the timer 18 outputs a IF-band switching signal to the changeover switch 15.

Figure 9A:
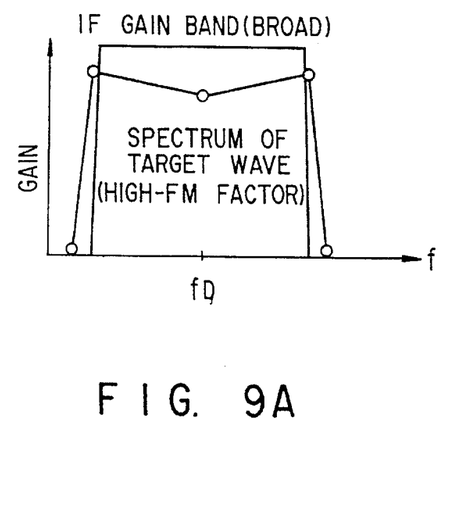
FIG. 9A and 9B are graphs illustrating the gain and amplitude characteristic of the broad-band IF amplifier used in the fourth embodiment.
Figure 9B:
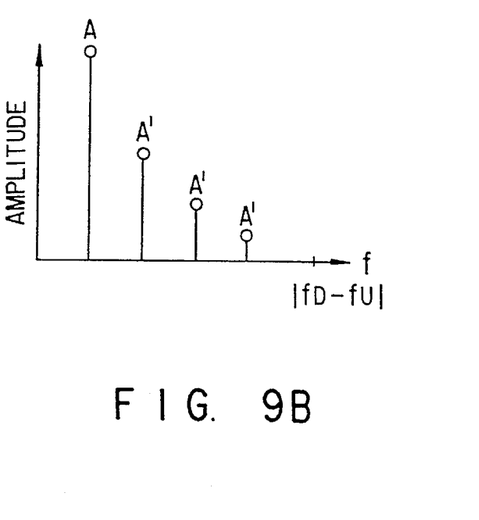

In the fourth embodiment (FIG. 8), when the FM amplitude detector 41 detects an FM signal having an excessively great amplitude due to the high FM modulation factor of the target station, the changeover switch 15 selects the output of the broad-band IF amplifier 13 even though the adjacent interference detector 17 detects adjacent interference. After the out put of the broad-band IF amplifier 13 has been selected, switching the FM band to the broad one, those portions of the FM signal are amplified which fall within the broad IF band which covers the entire frequency spectrum of the target wave as is shown in FIG. 9A. Therefore, the amplitudes of those portions of the FM signal, falling within the frequency range of fD–fU, are almost nil as is illustrated in FIG. 9A. As a result of this, the IF band can remain broad. Moreover, since the IF band is held broad when the FM modulation factor of the target station is relatively high, the harmonic components of the FM signal output by the FM detector 16 are less distorted than otherwise. This enables the FM receiver to supply high-quality FM signals.

When an FM factor is said to be high, it generally means that the FM factor is more than 100%. In many countries, the FM factor of 100% is defined as about twice the minimum interoffice frequency. Adjacent interference will therefore occur only if the FM signal of the channel next to the target channel contains a 100% frequency-modulated wave. In Europe, for example, the minimum interoffice frequency is 50 KHz and the standard FM modulation factor is a ±40 KHz deviation which corresponds to a band of approximately 100 KHz.

Figure 10:
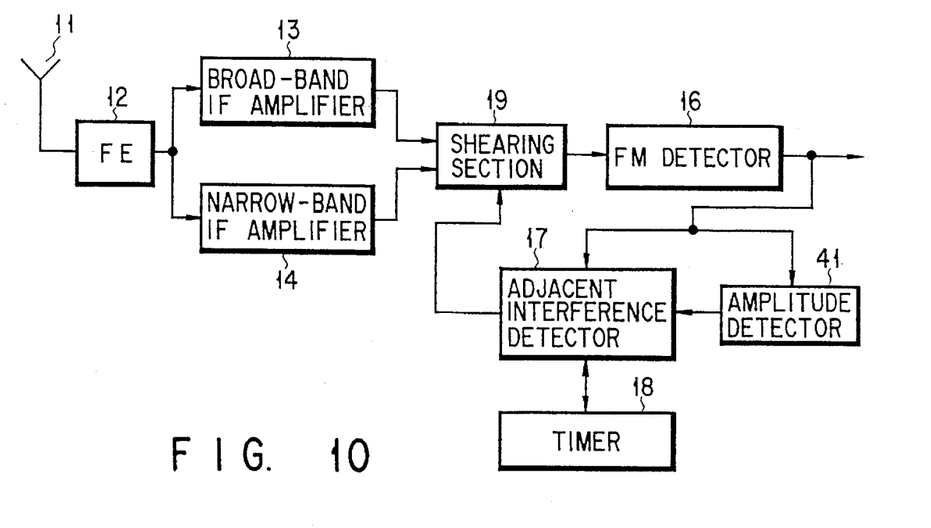
FIG. 10 is a block diagram showing a fifth embodiment of this invention.

FIG. 10 shows an FM receiver according to the fifth embodiment of this invention. This FM receiver is improved over the second embodiment shown in FIG. 3 in the same meaning as the fourth embodiment is an improvement of the first embodiment.

As is clearly seen from FIG. 10, the FM receiver differs from the FM receiver of FIG. 3 only in that an FM amplitude detector 41 is connected between the output of the FM detector 16 and the adjacent interference detector 17. In the FM amplitude detector 41, a predetermined threshold value is set for the amplitude of the FM signal output by the FM detector 16. When the FM detector 16 detects an FM signal having an amplitude equal to or greater than the threshold value, the shearing section 19 outputs the entire output (100%) of the broad-band IF amplifier 13 under the control of the signal supplied from the adjacent interference detector 17, in spite of the control the timer 18 performs.

Like the FM receiver shown in FIG. 8, the FM receiver according to the fifth embodiment outputs 100% of the signal output by the broad-band IF amplifier 13, despite the adjacent interference which the detector 17 detects when the FM modulation factor of the target station is relatively high and the FM amplitude detector 41 inevitably obtains a FM signal having a large amplitude.

Figure 11:
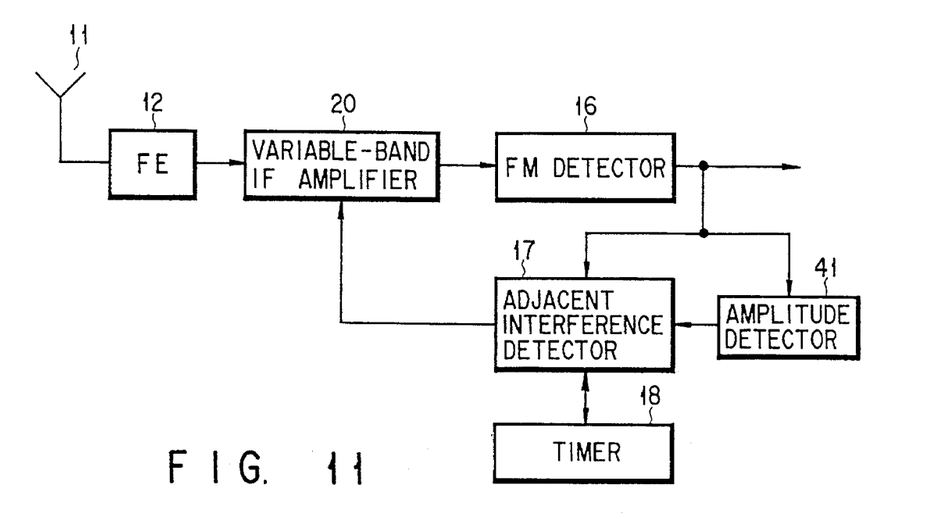
FIG. 11 is a block diagram showing a sixth embodiment of the invention.

FIG. 11 shows an FM receiver according to the sixth embodiment of the invention. This FM receiver is improved over the second embodiment shown in FIG. 4 in the same meaning as the fourth embodiment is an improvement of the first embodiment. Namely, as clearly shown in FIG. 11, an FM amplitude detector 41 is connected between the out put of the FM detector 16 and the adjacent interference detector 17. In the FM amplitude detector 41, a predetermined threshold value is set for the amplitude of the FM signal output by the FM detector 16. When the FM detector 16 detects an FM signal having an amplitude equal to or greater than the threshold value, the IF band of the variable-band IF amplifier 20 is switched to a broad IF band.

Figure 12:
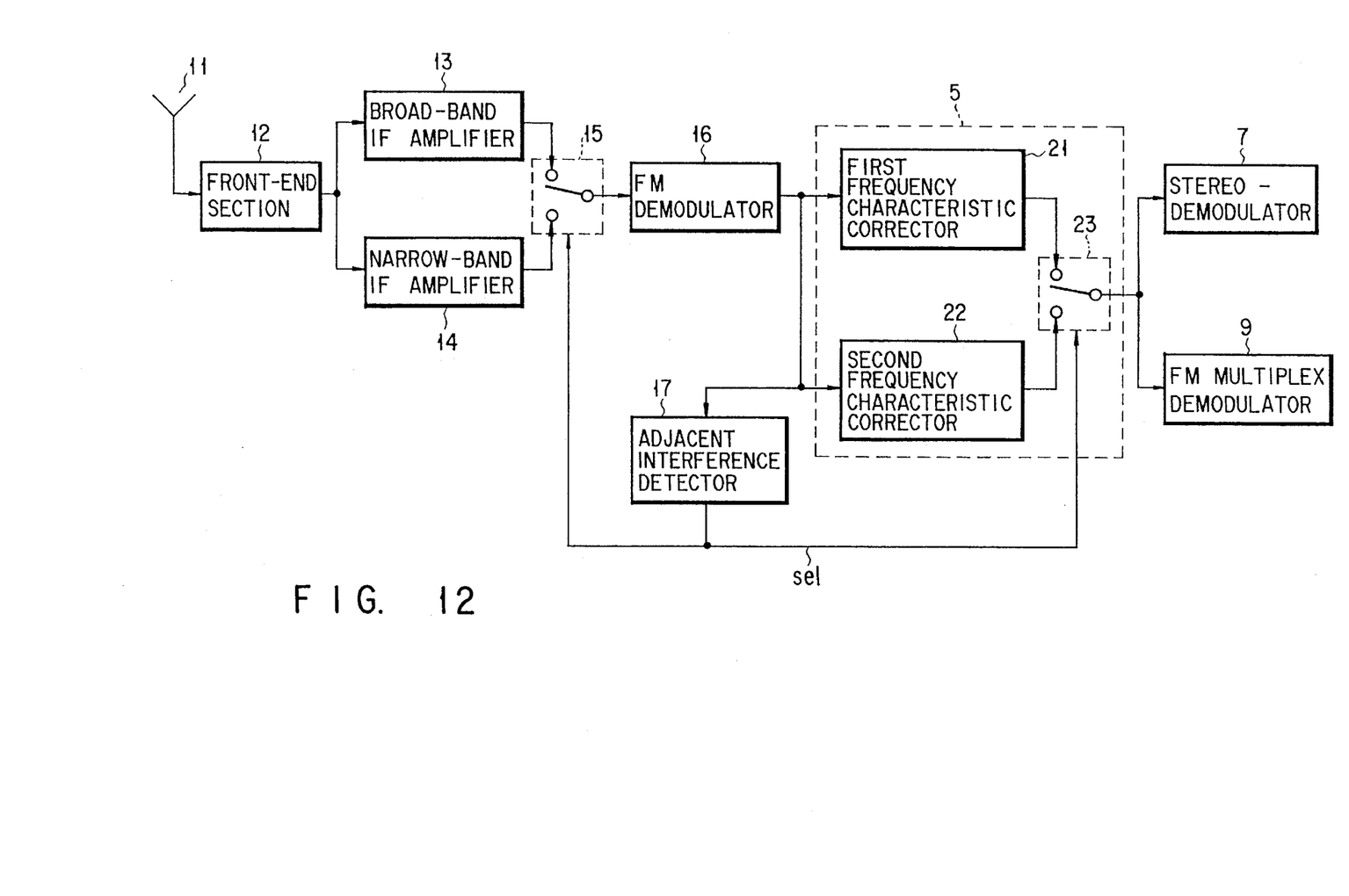
FIG. 12 is a block diagram showing a seventh embodiment of this invention.

FIG. 12 shows an FM stereophonic tuner which is the seventh embodiment of this invention. As is evident from FIG. 12, the FM stereophonic tuner comprises a frequency-characteristic corrector 5, a stereo-demodulator 7, an FM multiplex demodulator 9, an antenna 11, an FM front-end section 12, a broad-band IF amplifier 13, a narrow-band IF amplifier 14, a changeover switch 15, an FM demodulator, and an adjacent interference detector 17. The FM front-end section 12 is connected to the antenna 11. The IF amplifier 13 and 14 have their inputs connected to the output of the FM front-end section 12. The changeover switch 15 is of the same type as is used in the first, second and third embodiment, for selecting the output of the amplifier 13 or that of the amplifier 14, thereby switching the IF band of the receiver. The FM demodulator 16 is designed to perform FM demodulation on the output of the amplifier 13 or that of the amplifier 14, selected by operating the changeover switch 15. The adjacent interference detector 17 generates a select signal sel when it detects an adjacent interfering wave in the output of the FM demodulator 16. The signal sel is supplied to the changeover switch 15, operating the switch 15 to select the output of the narrow-band IF amplifier 14. The frequency-characteristic corrector 5 is designed to correct the frequency characteristic of a composite signal in accordance with the operation of the changeover switch 15. The stereo-demodulator 7 stereo-demodulates the output of the frequency-characteristic corrector 5. The FM multiplex demodulator 9 FM-multiplexes the output of the frequency-characteristic corrector 5.

The frequency-characteristic corrector 5 comprises a first frequency-characteristic corrector 21, a second frequency-characteristic corrector 22, and a changeover switch 23. The corrector 21 corrects the frequency characteristic of the composite signal in accordance with the IF band of the broad-band IF amplifier 13. The corrector 22 corrects the frequency characteristic of the composite signal in accordance with the IF band of the narrow-band IF amplifier 14. The changeover switch 23 is operated by the select signal sel output by the adjacent interference detector 17. Hence, the frequency-characteristic corrector 5 corrects the frequency characteristic of the composite signal containing FM-multiplex signals. As a result, stereo-full separation is accomplished, and a signal for FM-multiplex demodulation can be held at a predetermined level, regardless of which IF band, the broad IF band or the narrow IF band, has been selected. The frequency-characteristic corrector 5 can produce the signal for FM-multiplex demodulation.

If the adjacent interference detector 17 detects an adjacent interfering wave in the output of the FM demodulator 16, it produces a select signal sel which causes the switch 15 to select the output of the narrow-band IF amplifier 14. The IF band of the FM receiver is thereby switched to the narrow one. As a result, those portions of the FM signal which falls within the narrow IF band are supplied to the FM demodulator 16. This reduces the influence of the adjacent interference.

Figure 13:
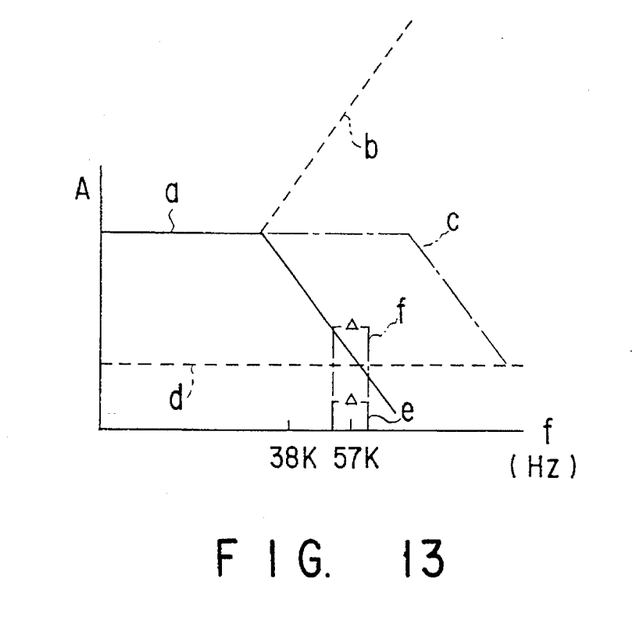
FIG. 13 is a graph representing the IF-band characteristic of the IF amplifier used in the seventh embodiment, and also showing the frequency characteristic of the FM demodulator incorporated in the seventh embodiment.

FIG. 13 is a graph explaining the advantage achieved by the frequency-characteristic correction performed by the corrector 5. In FIG. 13, the solid line a indicates the frequency-characteristic of the output of the FM demodulator 16, which is to be corrected. The broken line b represents the frequency characteristic of the second frequency-characteristic corrector 22. The one-dot, one-dash line c shows the frequency-characteristic of the output of the corrector 22, i.e., the corrected frequency-characteristic of the output of the FM demodulator 16. Also in FIG. 13, the broken line d shows the sensitivity of the FM multiplex demodulator 9. The solid line e represents an FM-multiplexed signal which is to be corrected. The one-do, one-dash line f indicates the FM-multiplexed signal which has been corrected. As can be understood from FIG. 13, the FM-multiplexed signal e, which is at the level lower than the required level d, is corrected with its level raised to level f which is sufficiently higher than the level d. In other words, since the the corrected frequency-characteristic of the output of the FM demodulator 16 is corrected as is shown by the one-dot, one-dash line c, stable FM-multiplex modulation is accomplished despite of the IF-band switching.

With the seventh embodiment (FIG. 12) it is possible to reduce or eliminate adjacent interference by switching the IF-band switching (i.e., by selecting the IF amplifier 13 or the IF amplifier 14), and to maintain the FM signal at the level optimal for stereo-full separation and FM-multiplex demodulation, by correcting the frequency-characteristic of the FM-demodulated signal in accordance with which IF amplifier has been selected.

Figure 14:
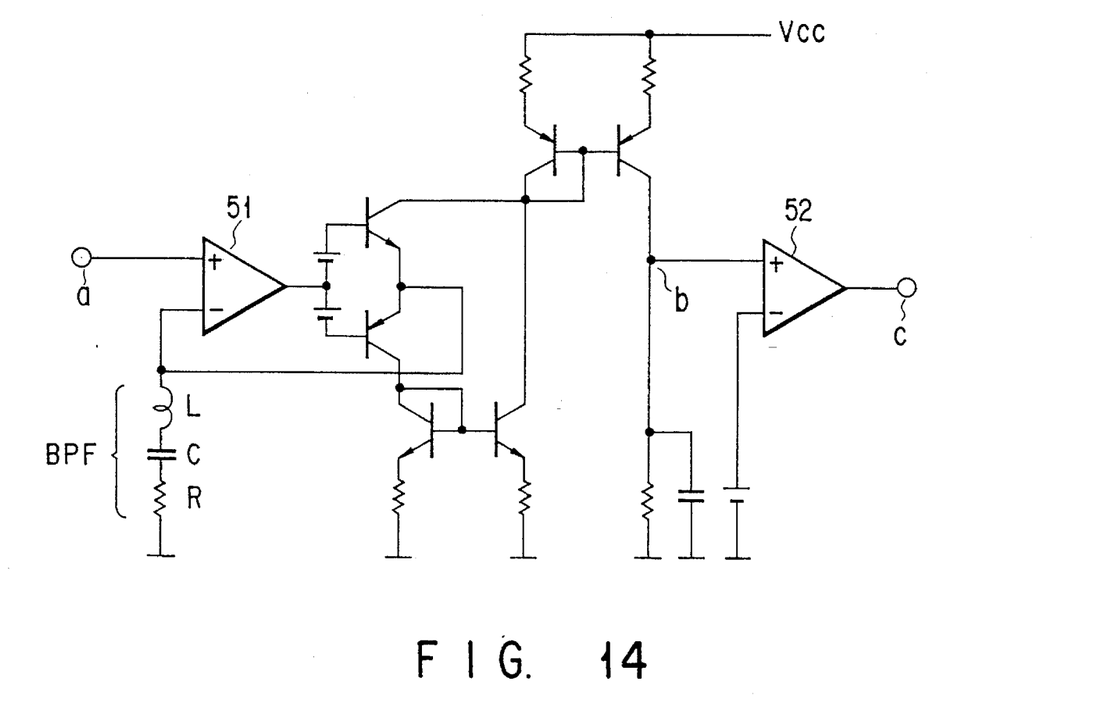
FIG. 14 shows an example of circuits which can be used as adjacent interference detector used in each of the first to seventh embodiments.

FIG. 14 shows a circuit which can be used as adjacent interference detector 17 used in each of the first to seventh embodiments, and FIGS. 15A to 16D are graphs explaining the operation of the adjacent interference detector shown in FIG. 14.

Figure 15A:
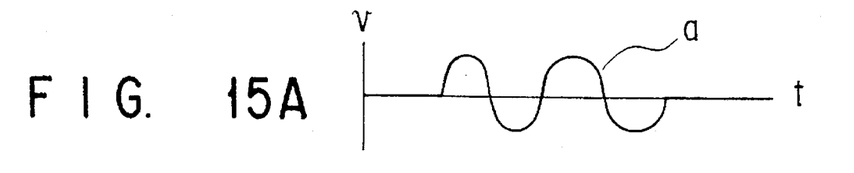
FIGS. 15A to 15D are graphs explaining the operation of the adjacent interference detector shown in FIG. 14.
Figure 15B:
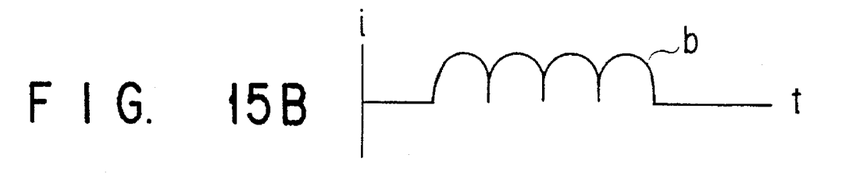
Figure 15C:
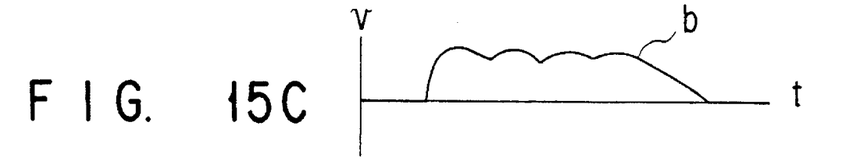
Figure 15D:
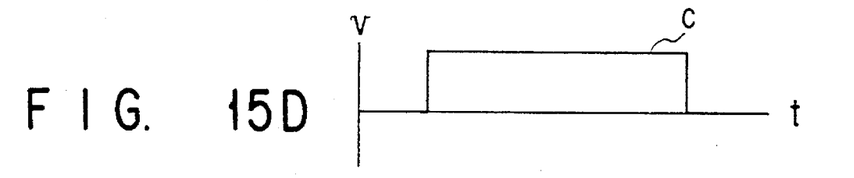

As shown in FIG. 14, this circuit has an input terminal a, a differential amplifier 51, a comparator 52, and a band-pass filter BPF. If there is an interfering wave whose frequency is similar to that of the target wave, the voltage at the input terminal a changes as is shown in FIG. 15A, the comparator 52 receives a signal having the current characteristic illustrated in FIG. 15B and the voltage characteristic shown in FIG. 15C, and the comparator 52 outputs a signal c shown in FIG. 15D. The filter BPF comprises a reactor of 1 mH, a capacitor of 1800 pF, and a resistor of 510 Ω. The filter BPF can be replaced by one which consists of a capacitor and a resistor only.

Figure 16:
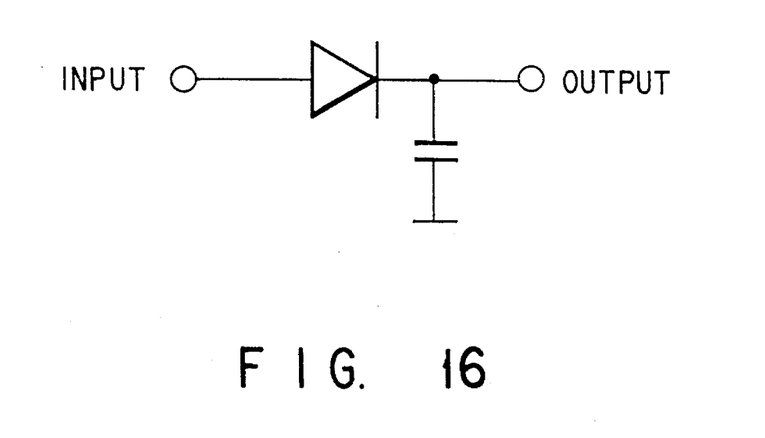
FIG. 16 shows an example of circuits which can be used as amplitude detector in the fourth, fifth and sixth embodiments.

FIG. 16 shows a circuit which can be used as amplitude detector 41 in the fourth, fifth and sixth embodiments.

Figure 17:
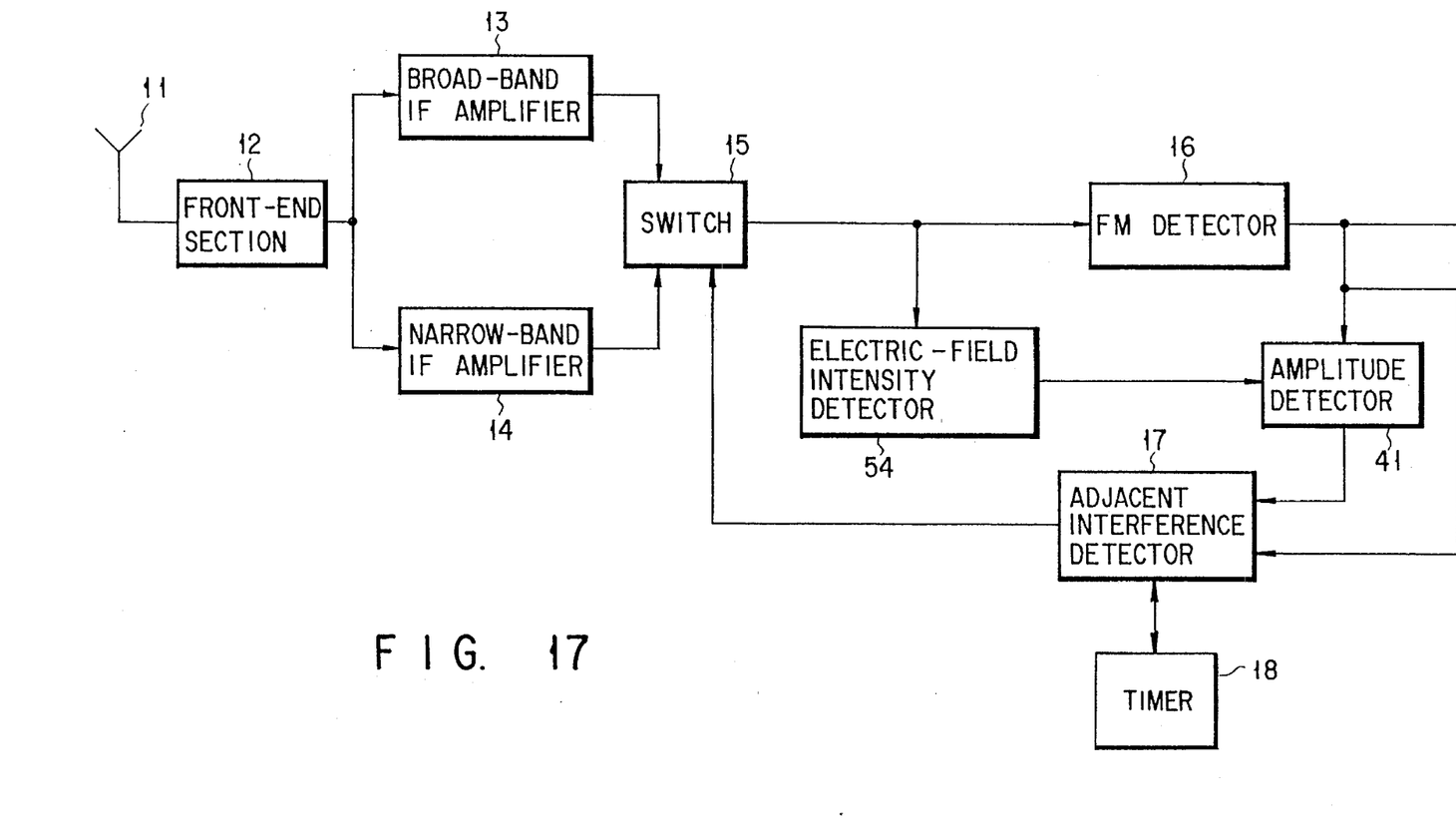
FIG. 17 is a block diagram showing an eighth embodiment of the present invention.

FIG. 17 shows an FM receiver which is the eighth embodiment of the present invention. This receiver is identical to the fourth embodiment of FIG. 8, except that an electric-field intensity detector 54 are used to select an IF band in accordance with the intensity of the electric field applied on the desired station's FM wave.

If the electric field applied on the desired station's FM wave has an intensity than a predetermined value, the level of the amplitude width of the FM demodulation band may be too low while the IF band remains the narrow one in order to eliminate adjacent interference. In this case, the FM signal cannot be detected completely, and the sound reproduced from the FM signal may contain noise. To solve this problem, the broad IF band is maintained in the FM receiver of FIG. 17 as long as the electric field on the target FM wave has an insufficient intensity, even if there has occurred adjacent interference. Thus, the FM signal cannot be detected with high reliability.

In any embodiment described above, the IF band is switched upon detection of any interfering wave having a frequency adjacent to that of the desired station's FM signal, thereby eliminating the adjacent interference and ultimately accomplishing stable FM demodulation on the desired station's FM signal. Since the adjacent interfering wave is removed in an intermediate-frequency region, the embodiments of the invention can be more simple than otherwise. Some of the embodiments can not only reduce or eliminate adjacent interference but also achieve stable FM demodulation, thanks to the use of additional components.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A frequency modulation receiving apparatus comprising:

means for converting a signal received by an antenna into a signal consisting of wave clusters having various frequencies;

first limiting means for limiting those of the wave clusters which have frequencies outside a first frequency range;

second limiting means for limiting those of the wave clusters which have frequencies outside a second range narrower than the first frequency range;

means for receiving a first signal output from the first limiting means and a second signal output from the second limiting means, and for outputting the first and second signals in a changeable ratio in accordance with a ratio control signal;

means for frequency-demodulating the signal output from the signal-receiving and outputting means;

means for detecting whether or not an adjacent interfering wave exists in the signal output from the frequency-demodulating means when the signal-receiving and outputting means receives and outputs the first signal output from the first limiting means;

means for measuring a predetermined time period when the first signal-receiving and outputting means has started outputting the second signal; and means for outputting the ratio control signal so that the signal-receiving and outputting means outputs the first and second signals in a predetermined ratio in an initial state just after power on, changes the changeable ratio to increase a value of the second signal when the detecting means detects the adjacent interfering wave exist in the signal output from the frequency de-modulating means, maintains the changeable ratio until the measuring means has measured the predetermined time period, even when the detecting means that the adjacent interfering wave does not exist in the signal output from the frequency-demodulating means, and changes the changeable ratio to increase a value of the first signal regardless a result of detection by the detecting means when the measuring means has measured the predetermined time period.

2. An apparatus according to claim 1, wherein the signal-received and outputting means has a switching element designed to output the first signal output by the first limiting means or the second signal output by the second limiting means.

3. An apparatus according to claim 1, wherein the detecting means outputs a ratio control signal having a second value and then a ratio control signal representing presence or absence of the adjacent interfering wave, thereby causing the signal-receiving and outputting means to output the first signal output of the first limiting means upon lapse of the predetermined period.

4. An apparatus according to claim 1, wherein the predetermined period is one second.

5. An apparatus according to claim 1, further comprising amplitude detecting means for detecting an amplitude of the signal output by the frequency-demodulating means, wherein the adjacent interfering wave detecting means outputs the ratio control signal in accordance with both the adjacent interfering wave detection and the amplitude detection.

6. An apparatus according to claim 5, further comprising electric field detecting means for detecting an electric field intensity of the first and second signals output by the signal-receiving and outputting means, wherein the adjacent interfering wave detecting means outputs the ratio control signal in accordance with the adjacent interfering wave detection, the amplitude detection, and the electric field intensity detection.

7. A frequency modulation receiving apparatus comprising:

means for converting a signal, received by an antenna, into a signal consisting of wave clusters having various frequencies;

first limiting means for limiting those of the wave clusters which have frequencies outside a first frequency range;

second limiting means for limiting those of the wave clusters which have frequencies outside a second frequency range narrower than the first frequency range;

means for receiving a first signal output from the first limiting means and a second signal output from the second limiting means, and for outputting the first and second signals in accordance with a ratio control signal;

means for frequency-demodulating the signal output from the signal-receiving and outputting means;

means for detecting whether an adjacent interfering wave exists in the signal output from the frequency-demodulating means when the signal-receiving and outputting means receives and outputs the first signal output from the first limiting means;

means for measuring a predetermined time period when the signal-receiving and outputting means has started outputting the second signal; and outputting means for outputting said ratio control signal so that the signal-receiving and outputting means outputs the first and second signals in a predetermined ratio in an initial state just after power on, outputs the second signal when the detecting means detects that the adjacent interfering wave exists in the signal output from the frequency-demodulating means, outputs the second signal until the measuring means has measured the predetermined time period even when the detecting means detects that the adjacent interfering wave does not exist in the signal output from the frequency-demodulating means, and outputs the first signal regardless of a result of detection by the detecting means when the measuring means has measured the predetermined time period.

8. An apparatus according to claim 7, wherein the predetermined period is about one second.

9. An apparatus according to claim 7, further comprising amplitude detecting means for detecting an amplitude of the signal output by the frequency-demodulating means, wherein the adjacent interfering wave detecting means outputs the control signal in accordance with both the adjacent interfering wave detection and the amplitude detection.

10. An apparatus according to claim 9, further comprising electric field detecting means for detecting an electric field intensity of the first and second signals output by the signal-receiving and outputting means, wherein the adjacent interfering wave detecting means outputs the control signal in accordance with the adjacent interfering wave detection, the amplitude detection, and the electric field intensity detection.

* * * * *